United States Patent
Schuette

(10) Patent No.: US 8,335,099 B2
(45) Date of Patent: Dec. 18, 2012

(54) OPTICAL MEMORY DEVICE AND METHOD THEREFOR

(75) Inventor: Franz Michael Schuette, Colorado Springs, CO (US)

(73) Assignee: OCZ Technology Group, Inc., San Jose, CA (US)

( * ) Notice: Subject to any disclaimer, the term of this patent is extended or adjusted under 35 U.S.C. 154(b) by 203 days.

(21) Appl. No.: 12/859,339

(22) Filed: Aug. 19, 2010

(65) Prior Publication Data

US 2011/0044086 A1   Feb. 24, 2011

Related U.S. Application Data

(60) Provisional application No. 61/235,097, filed on Aug. 19, 2009.

(51) Int. Cl.
*G11C 13/00*   (2006.01)
(52) U.S. Cl. .................... 365/113; 365/163; 365/215
(58) Field of Classification Search ................ 365/113, 365/163, 215, 129, 185.21, 189.03, 198
See application file for complete search history.

(56) References Cited

U.S. PATENT DOCUMENTS

| 7,170,609 B2 * | 1/2007 | Potyrailo et al. .............. 356/440 |
| 2007/0047964 A1 * | 3/2007 | Ooi et al. ...................... 398/147 |
| 2007/0248785 A1 * | 10/2007 | Nakai et al. .................. 428/64.4 |
| 2008/0291456 A1 * | 11/2008 | Ghislain ....................... 356/450 |

* cited by examiner

*Primary Examiner* — Dang Nguyen
(74) *Attorney, Agent, or Firm* — Hartman Global IP Law; Gary M. Hartman; Domenica N.S. Hartman

(57) ABSTRACT

A nonvolatile memory device and method using phase changes in a substrate to alter optical properties of the substrate for the purpose of data storage. The memory device includes a substrate containing a phase change material having phases comprising amorphous and crystalline phases. The phase change material has optical properties that change depending on whether the phase change material is in the amorphous phase or the crystalline phase. The memory device is further equipped with one or more devices that generate light and transmit the light into the substrate, and one or more devices that cause the phase change material to change between the amorphous and crystalline phases thereof. At least one optical sensing device detects light that passes into the phase change material to the optical sensing device and generates electrical signals based thereon, which are converted into bit values if they exceed a threshold.

19 Claims, 4 Drawing Sheets

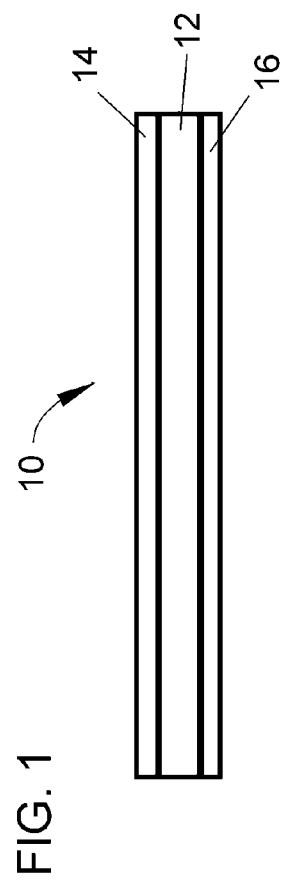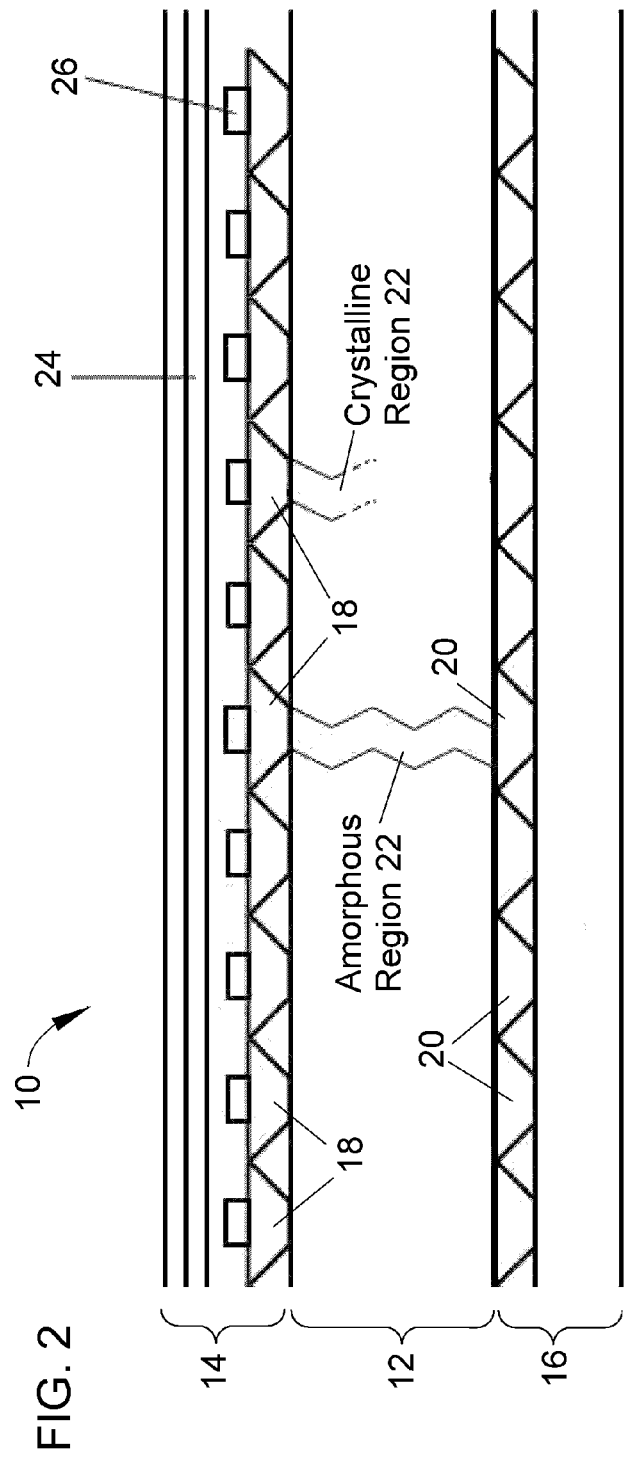
FIG. 1
FIG. 2

OPTICAL MEMORY DEVICE AND METHOD THEREFOR

CROSS REFERENCE TO RELATED APPLICATIONS

This application claims the benefit of U.S. Provisional Application No. 61/235,097 filed Aug. 19, 2009. The contents of this prior application are incorporated herein by reference.

BACKGROUND OF THE INVENTION

The present invention generally relates to memory devices for use with computers and other processing apparatuses. More particularly, this invention relates to a nonvolatile or permanent memory-based mass storage device using phase change material in combination with optical sensing as a memory storage substrate. Sensing of data is achieved using optoelectronic cells measuring the change of optical transference of the substrate as a consequence of phase change.

Mass storage devices such as advanced technology (ATA) or small computer system interface (SCSI) drives are rapidly adopting nonvolatile memory technology such as flash memory or other emerging solid state memory technology including phase change memory (PCM), resistive random access memory (RRAM), magnetoresistive random access memory (MRAM), ferromagnetic random access memory (FRAM), organic memories, or nanotechnology-based storage media such as carbon nanofiber/nanotube-based substrates. The currently most common technology uses NAND flash memory as inexpensive storage memory.

Despite all its advantages with respect to speed and price, flash memory has the drawback of limited endurance and data retention caused by the physical properties of the floating gate, the charge of which defines the bit contents of each cell. Typical endurance for multilevel cell NAND flash is currently in the order of 10,000 write cycles at 50 nm process technology and approximately 3000 write cycles at 4× nm process technology, and endurance is decreasing with every process node. Data retention is influenced by factors like temperature and number or frequency of accesses, wherein access can either be read or write and further is not confined to the cell holding critical data but can also encompass any cell in the physical proximity of the cell of interest.

Alternative technologies have evolved around phase change materials, that is, materials that upon exposure to heat will change their physical properties in a controlled manner. A well established example are optical media such as CD-ROM and DVD-ROM that use lasers to melt regions in the surface of the media associated with addresses, wherein the resulting changes in the reflectivity of the surface regions create bit values. Optical phase change is primarily used in rotatable media and provides for very inexpensive mass storage and archival media, though with the drawback of very limited re-write capability. Another area in which phase change is used is only currently emerging to market-suitable maturity. This technology employs heat-induced phase change to alter the physical properties of a chalcogenide alloy of germanium, antimony and tellurium ($Ge_2Sb_2Te_5$), known as GST, from amorphous to crystalline. The change affects the electrical resistance of a small area within the media, which can be measured as the current/voltage (IV) relation to indicate High or Low (1 or 0) as bit value. Writing is performed by Joule heating, that is, driving current across a resistor and the media to a second electrode on the back of the chalcogenide media. Depending on the temperature and duration of the heat pulse, the chalcogenide substrate changes from the amorphous to the crystalline phase. In contrast to NAND flash, where writing data can only change bit values from 1 to 0, therefore requiring an erase cycle to write "1" values to every cell before re-writing it, PCM can be written in both directions by changing the duration and amplitude of the heat pulse. A heat pulse can also be a light pulse in this context. The advantage is that there is no need for any intermittent erase if data have to be re-written.

Optical signaling has some advantages over electrical signaling and, in fact, optical interconnects are often the media of choice when it comes to high speed interconnects. Likewise, as mentioned above, data storage based on the phase change of optical properties preceded data storage based on the phase change of resistance properties. Because of the versatility of optical signaling, having for example different properties depending on wave length, lower thermal load, and lack of capacitive coupling among other factors, it should be advantageous to have a phase change memory using optical transference differentials as a function of substrate phase change for data storage.

BRIEF SUMMARY OF THE INVENTION

The present invention provides a nonvolatile memory using phase changes in a substrate to alter optical properties of the substrate for the purpose of data storage.

According to a first aspect of the invention, a memory device is provided that comprises a substrate containing a phase change material having phases comprising amorphous and crystalline phases. The phase change material has optical properties that change depending on whether the phase change material is in the amorphous phase or the crystalline phase. The memory device further includes means for generating light and transmitting the light into the substrate, means for causing the phase change material to change between the amorphous and crystalline phases thereof, at least one optical sensing device adapted to detect light from the light generating means that passes into the phase change material to the optical sensing device and generate electrical signals based thereon, and means for converting the electrical signals into bit values if they exceed a threshold.

According to a second aspect of the invention, a method is provided for storing data using a phase change material. The method comprises writing data by inducing a phase change in at least one region of a phase change material of a substrate. The phase change material has phases comprising amorphous and crystalline phases, and has optical properties that change depending on whether the phase change material is in the amorphous phase or the crystalline phase. The method further comprises reading data by activating at least one light source to generate light that passes into the substrate and is insufficient to change the phase of the phase change material within a region of the substrate. At least one optical sensing device of an array of optical sensing devices is activated to detect light from the light source transmitted from the phase change material to the optical sensing device, and then generates at least one electrical signal if light from the light source is detected. The electrical signal is then captured, determined to be either above or below a threshold, and converted into a bit value according to its level relative to the threshold.

Other objects and advantages of this invention will be better appreciated from the following detailed description.

BRIEF DESCRIPTION OF THE DRAWINGS

FIG. 1 is a side view of a memory device according to a first embodiment of the invention, wherein the memory device has a multilayer structure comprising an array of light sources located at one surface of a substrate formed of a phase change material, and an array of optical sensing devices located at an opposite surface of the substrate.

FIG. 2 is a detailed cross-sectional view of the device of FIG. 1 showing a row of light sources of the array of light sources individually aligned with a row of sensing devices of the array of optical sensing devices.

DETAILED DESCRIPTION OF THE INVENTION

Figure 3:
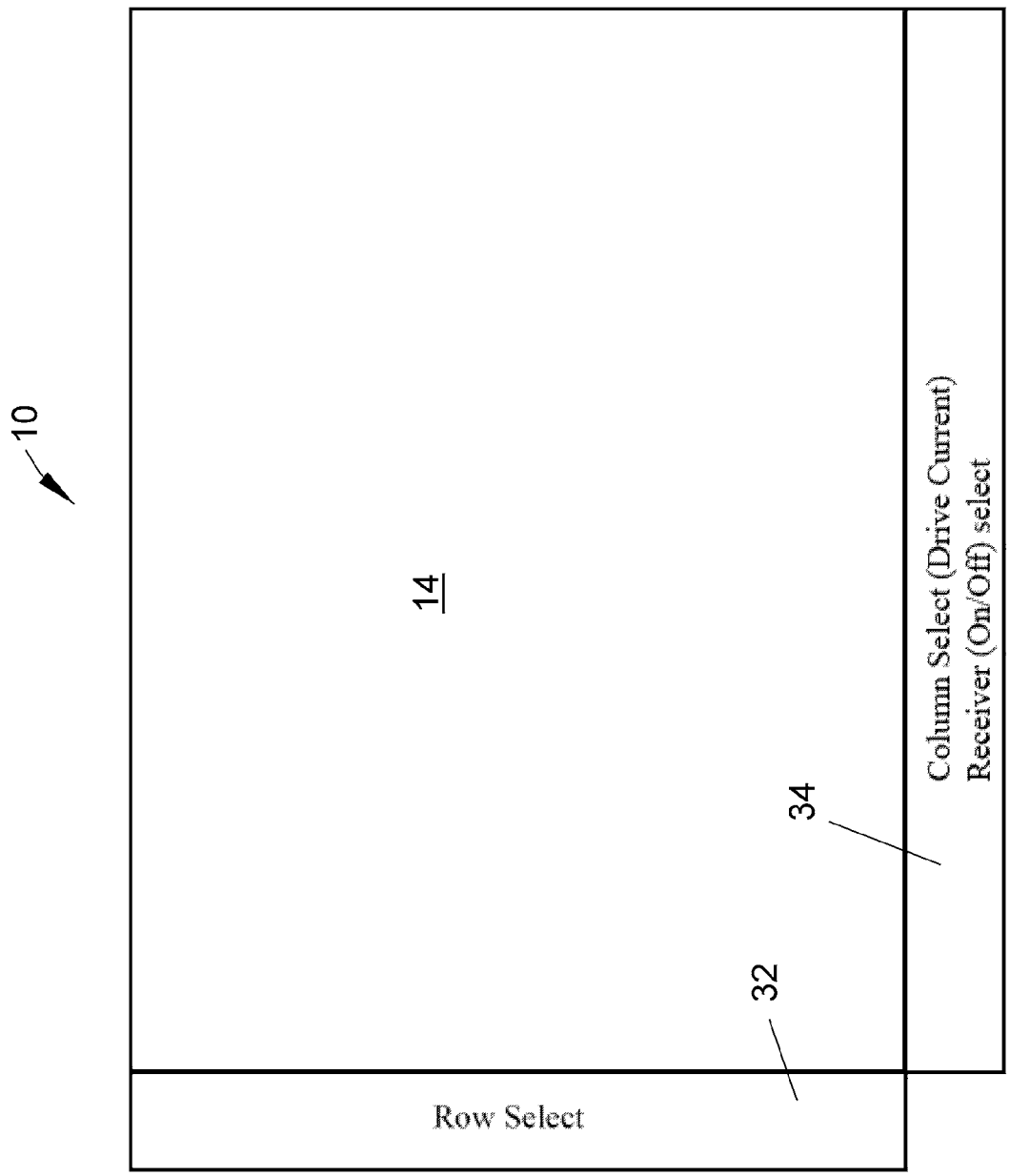
FIG. 3 is a schematic representation of a row and column select for the arrays of light sources and sensing devices of FIGS. 1 and 2.

The invention described below is suitable for use as nonvolatile memory of the computer system, such as a personal computer (PC). FIG. 1 shows the macrostructure of a nonvolatile memory device 10 having a multilayer structure comprising a substrate 12 formed of a phase change material, a layer 14 disposed at one surface of the substrate 12 and containing an array of light sources (18 in FIG. 2), and a second layer 16 disposed at the surface opposite the layer 14 and containing an array of optical sensing devices (20 in FIG. 2). The light sources 18 may be, for example, light emitting diodes (LEDs), and the sensing devices 20 may be photon sensors, for example, CMOS optical (image) sensors of the type used in digital cameras, though other types of light sources and optical sensing devices are also within the scope of the invention. The phase change material of the substrate 12 is selected to be alterable with light between two phases: an amorphous phase and a crystalline phase, between which the material exhibits different transparencies to light. Suitable substrate materials for certain embodiments of this invention are believed to include the chalcogenide alloy of germanium, antimony and tellurium ($Ge_2Sb_2Te_5$) known as GST, though the use of other phase change materials is foreseeable.

FIG. 2 represents a detailed fragmentary cross-sectional view of the memory device 10 of FIG. 1. In particular, FIG. 2 shows a row of the array of light sources 18 embedded within the layer 14, and a row of the array of optical sensing devices 20 embedded within the layer 16. The layer 14 further contains an array of rows (wordlines) 24 and columns (bitlines) 26 whose intersections constitute addresses of the memory device 10. In this configuration, any of the light sources 18 can be selected to generate a pulse of light through regions 22 within the substrate 12 located at the intersections of the wordlines 24 and bitlines 26. Each region 22 effectively forms part of a memory cell of the memory device 10, wherein changes in the reflectivity/transparency of the regions 22 are used to create bit values. During the writing of a bit, the appropriate wordline 24 and bitline 26 are charged to activate one of the light sources 18 to generate a high intensity pulse of light of sufficient duration to change the phase change material within the region 22 from the amorphous phase to the crystalline phase, or vice versa. If data are read, a lower intensity pulse of light is generated by a light source 18 so as not to cause a phase change of the phase change material within the region 22. The pulse is captured by one of the sensing devices 20 aligned with the light source 18 that generated the pulse. As depicted in FIG. 3, the selection of the light source 18 and a specific sensing device 20 (which further define the memory cell with the region 22 of the substrate 12 therebetween) can be accomplished by a row select 32 and column select 34 similar to the way a standard DRAM cell is selected. Depending on the phase of the phase change material within the substrate region 22, the light pulse will be transmitted through the substrate 12 or will be reflected or diffused by the substrate 12. In particular, if the substrate region 22 is in the amorphous phase, the light pulse will be transmitted through the substrate region 22 to the aligned sensing device 20, whereas if the substrate region 22 is in the crystalline phase the light pulse will be reflected or diffused by the substrate region 22, such that any light captured by the aligned sensing device 20 will be significantly lower than if the region 22 were in the amorphous phase.

Figure 5:
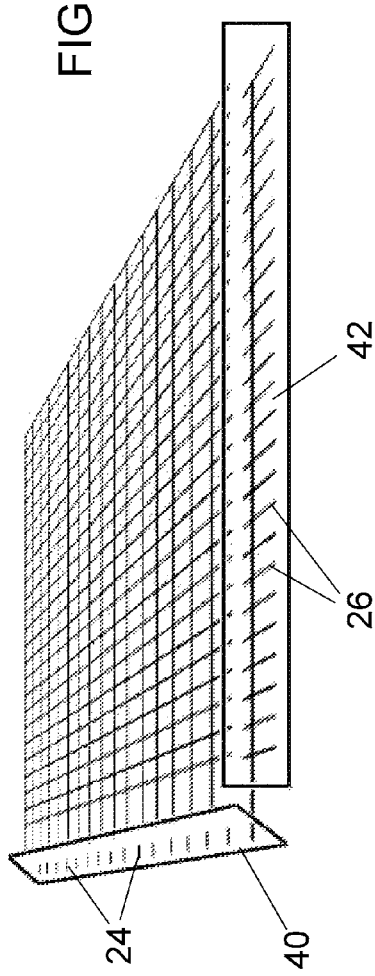
FIG. 5 is a schematic representation of a row and column select logic for selecting row and column select lines for activating individual light sources as well as the sensing devices aligned with the activated light sources.

In the preferred embodiment, the locations of the light sources 18 coincide with the locations of the optical sensing devices 20 with respect to the row and column addresses of the memory device 10 so as to minimize the effects of light scatter that may inadvertently occur as a consequence of crystallization. FIG. 5 schematically represents a row and column select logic for selecting row and column select lines 40 and 42 for activating individual light sources 18 at intersections of the wordlines 24 and bitlines 26, as well as those sensing devices 20 aligned with the activated light sources 18. One addressing approach is to provide vias (not shown) through the substrate 12 to enable simultaneously accessing of aligned pairs of light sources 18 and sensing devices 20. Another approach represented in FIG. 5 is to copy the address of the activated light source 18 to a second set of row and column select lines to activate the corresponding sensing device 20 through a gate transistor (not shown). With this approach, the gate transistor can be used to connect the light source 18 to a global power bus of the computer and the sensing device 20 to an input/output (I/O) line of the computer. If the gate transistor is open, no current flows to the light source 18 and therefore the light source 18 is not activated, i.e., the light source 18 is in an off state. Likewise, the sensing device 20 is not connected to the I/O line. If the gate transistor is closed, current flows into the light source 18 to cause the source 18 to generate a pulse of light. Simultaneously, the sensing device 20 is coupled to the I/O line, which in this case may be outputting data to the I/O circuitry.

Figure 4:
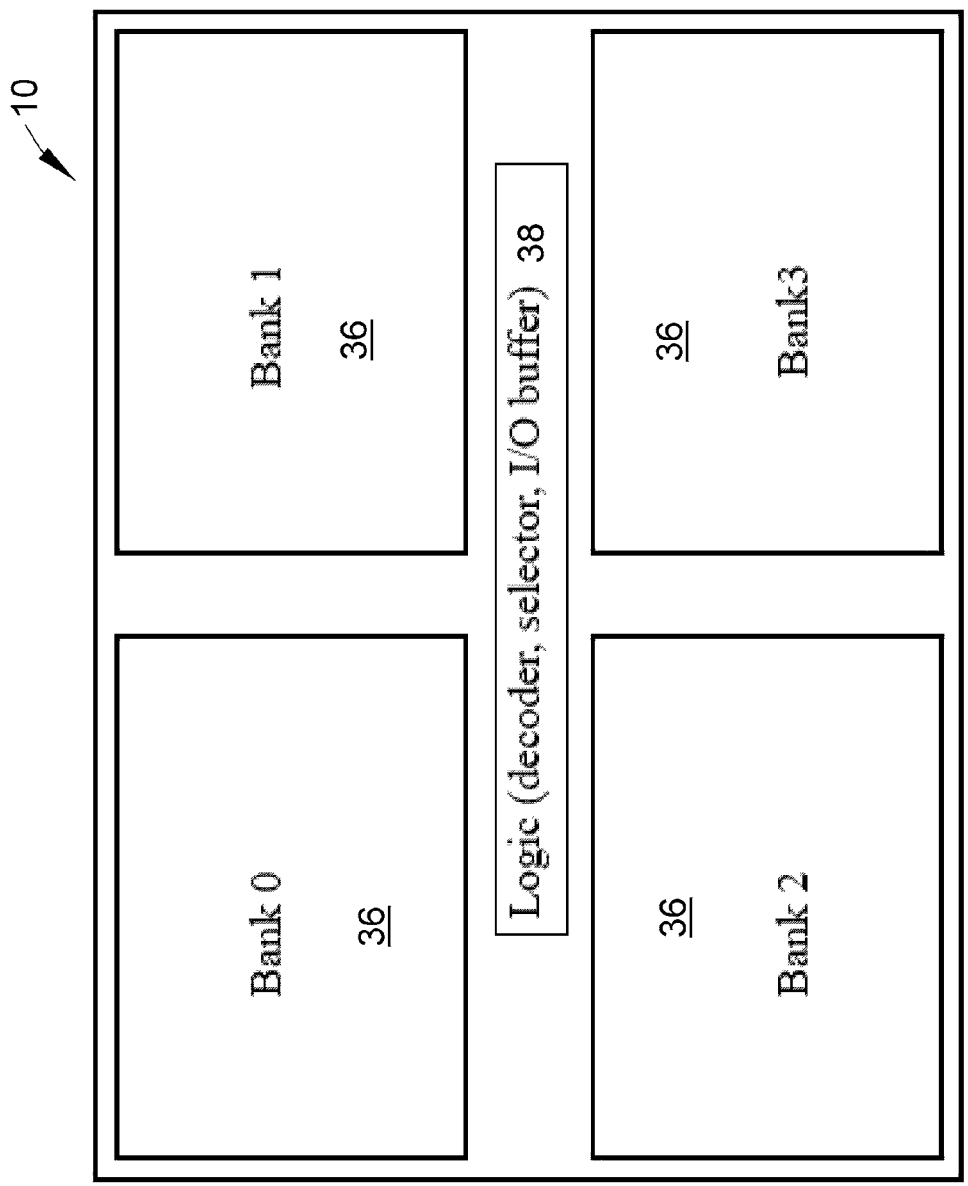
FIG. 4 is a schematic diagram of an IC layout for the memory device of FIG. 1, wherein the device is arranged as four physical banks of sub-arrays with a logic portion of the IC located between the sub-arrays.

The overall layout of the IC can follow that typically used in SDRAM at this point. For example, as represented in FIG. 4, blocks of aligned arrays of light sources 18 and sensing devices 20 may be configured as logical banks 36 with control logic 38 interspersed between the blocks. The control logic 38 can provide for time multiplexing of memory cell addresses, or the ability to simultaneously provide row and column addresses using a broad-side addressing scheme. The layout represented in FIG. 4 allows for easy integration of row and column select circuitry, potentially by using a DRAM or SRAM design library for the building blocks.

Figure 6:
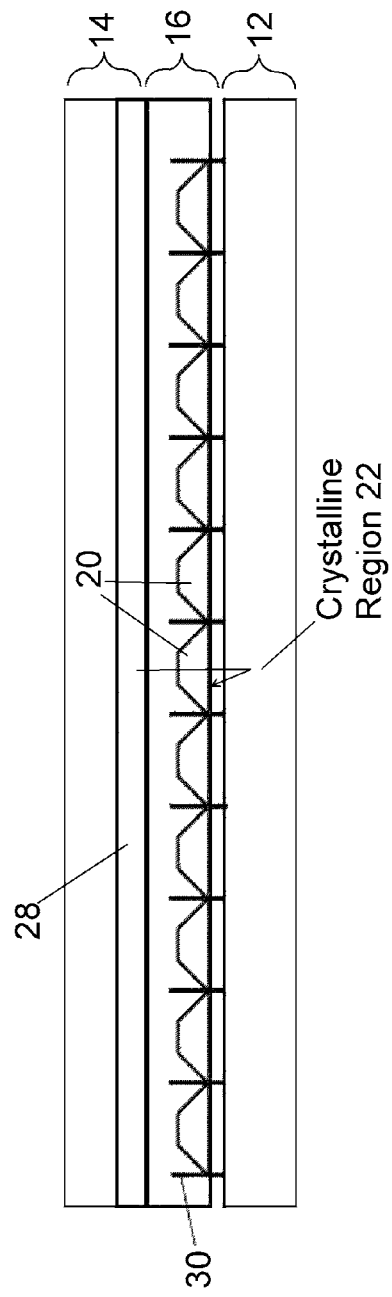
FIG. 6 represents a cross-sectional view of a memory device according to a second embodiment of the invention, wherein an array of optical sensing devices is accompanied by interspersed heating electrodes that thermally induce phase changes in a substrate formed of a phase change material.

In another embodiment represented in FIG. 6, the array of sensing devices 20 is located between the substrate 12 and a backlight 28, and data are sensed as changes in reflectivity of the substrate 12 due to phase changes between the amorphous and crystalline phases. The backlight 28 may comprise an array of individual light sources (similar to the light sources 18 of FIG. 2), or a diffuse layer of light guide material. To write data, the array of sensing devices 20 has an array of electrodes 30 associated therewith to perform Joule heating of individual regions 22 of the substrate 12 to induce changes in regions 22 of the substrate 12 from amorphous to crystalline, and vice versa. The sensing elements 20 then respond to light reflected by the regions 22 from the backlight 28 as a result of the electrodes 30 causing individual regions 22 of the substrate 12 to change from the amorphous phase to the crystalline phase. A shadow mask (not shown) can be located on either the array of sensing elements 20 or the backlight 28 to reduce stray light and scatter between cells.

While certain components are shown and preferred for the optical memory device of this invention, it is foreseeable that functionally-equivalent components could be used or subsequently developed to perform the intended functions of the disclosed components. Therefore, while the invention has been described in terms of a particular embodiment, it is apparent that other forms could be adopted by one skilled in the art, and the scope of the invention is to be limited only by the following claims.

The invention claimed is:

1. A memory device comprising:
a substrate containing a phase change material having phases comprising amorphous and crystalline phases, the phase change material having optical properties that change depending on whether the phase change material is in the amorphous phase or the crystalline phase;
means for generating light and transmitting the light into the substrate;
means for causing the phase change material to change between the amorphous and crystalline phases thereof by operating the light generating means to generate light pulses that pass into the substrate at an amplitude and pulse width sufficient to change the phase of the phase change material between the amorphous phase and the crystalline phase within regions of the substrate;
at least one optical sensing device adapted to detect light from the light generating means that passes into the phase change material to the optical sensing device and generate electrical signals based thereon; and
means for converting the electrical signals into bit values according to their level relative to a predetermined threshold.

2. The memory device of claim 1, wherein the light generating means comprises an array of individual light sources.

3. The memory device of claim 2, wherein the individual light sources are light emitting diodes.

4. The memory device of claim 2, further comprising means for selectively activating the individual light sources within the array using row and column selection.

5. The memory device of claim 2, wherein the optical sensing device comprises an array of individual optical sensing devices that are individually aligned with the individual light sources.

6. The memory device of claim 1, wherein the optical sensing device comprises an array of CMOS light sensing devices, the memory device further comprising means for addressing the CMOS light sensing devices within the array by row and column.

7. The memory device of claim 6, further comprising means for time multiplexing addresses of the CMOS light sensing devices.

8. The memory device of claim 7, wherein the time multiplexing means simultaneously gives row and column addresses.

9. A memory device comprising:
a substrate containing a phase change material having phases comprising amorphous and crystalline phases, the phase change material having optical properties that change depending on whether the phase change material is in the amorphous phase or the crystalline phase;
means for generating light and transmitting the light into the substrate, wherein the light generating means comprises backlighting means;
means for causing the phase change material to change between the amorphous and crystalline phases thereof;
at least one optical sensing device adapted to detect light from the light generating means that passes into the phase change material to the optical sensing device and generate electrical signals based thereon, wherein the at least one optical sensing device is one of an array of individual optical sensing device; and
means for converting the electrical signals into bit values according to their level relative to a predetermined threshold;
wherein the means for causing the phase change material to change between the amorphous and crystalline phases thereof comprises an array of electrodes adapted to heat individual regions of the substrate associated with the individual optical sensing devices.

10. The memory device of claim 9, wherein the array of individual optical sensing device is disposed between the backlighting means and the substrate.

11. The memory device of claim 9, wherein the backlighting means comprises an array of individual light sources.

12. The memory device of claim 9, wherein the backlighting means comprises a diffuse layer of light guide material.

13. A memory device comprising:
a substrate containing a phase change material having phases comprising amorphous and crystalline phases, the phase change material having optical properties that change depending on whether the phase change material is in the amorphous phase or the crystalline phase;
means for generating light and transmitting the light into the substrate;
means for causing the phase change material to change between the amorphous and crystalline phases thereof;
at least one optical sensing device adapted to detect light from the light generating means that passes into the phase change material to the optical sensing device and generate electrical signals based thereon, the optical sensing device comprising an array of CMOS light sensing devices, wherein the array of CMOS light sensing devices is one of a plurality of arrays of CMOS light sensing devices, each of the arrays being arranged as an internal bank of the memory device, the internal banks being spatially separated by logic structures;
means for addressing the CMOS light sensing devices within at least one of the arrays by row and column; and
means for converting the electrical signals into bit values according to their level relative to a predetermined threshold.

14. A method of storing data using a phase change material, the method comprising:
writing data by inducing a phase change in at least one region of a phase change material of a substrate, the phase change material having phases comprising amorphous and crystalline phases and having optical properties that change depending on whether the phase change material is in the amorphous phase or the crystalline phase, the writing step comprising activating at least one light source to generate a light pulse that passes into the substrate at an amplitude and pulse width sufficient to change the phase of the phase change material between the amorphous phase and the crystalline phase within a region of the substrate; and reading data by activating at least one light source to generate light that passes into the substrate and is insufficient to change the phase of the phase change material within a region of the substrate, activating at least one optical sensing device of an array of optical sensing devices to detect light from the light source transmitted through the phase change material to the optical sensing device, generating at least one electrical signal with the at least one optical sensing device if light from the light source is detected, capturing the at least one electrical signal, determining whether the at least one electrical signal is above or below a threshold, and converting the at least one electrical signal into a bit value according to its level relative to a predetermined threshold.

15. The method of claim 14, wherein the at least one light source is one of an array of light sources disposed at a first surface of the substrate.

16. The method of claim 15, further comprising selectively activating the light sources within the array using row and column selection.

17. The method of claim 16, wherein addressing of the light sources through rows and columns is time multiplexed.

18. The method of claim 16, wherein addressing of the light sources by row and column is substantially simultaneous using a broad-side addressing scheme.

19. The method of claim 14, wherein the writing step further comprises heating a region of the substrate to change the phase of the phase change material between the amorphous phase and the crystalline phase within the region.

* * * * *